United States Patent [19]

Becker et al.

[11] 4,131,934

[45] Dec. 26, 1978

[54] RECEPTACLE FIXTURE FOR EQUIPMENT UNITS IN ELECTRICAL COMMUNICATION TECHNOLOGY

[75] Inventors: Harry Becker, Wolfratshausen; Karl Doerflinger; Klaus Ey, both of Munich; Georg Reiter, Schliersee; Hermann Rutzmoser, Munich; Richard Theus, Wolfratshausen, all of Germany

[73] Assignee: Siemens Aktiengesellschaft, Berlin & Munich, Germany

[21] Appl. No.: 809,652

[22] Filed: Jun. 24, 1977

[30] Foreign Application Priority Data

Jun. 25, 1976 [DE] Fed. Rep. of Germany ....... 2628489

[51] Int. Cl.² ............................................. H02B 1/00
[52] U.S. Cl. .................................... 361/428; 361/395; 361/415; 339/176 MP; 339/17 L; 179/98
[58] Field of Search ................ 174/72 A; 179/98; 361/331, 380, 393–395, 412–415, 425–429, 400; 339/17 L, 17 LM, 17 LC, 17 M, 17 N, 176 MP

[56] References Cited

U.S. PATENT DOCUMENTS

| 3,270,251 | 8/1966 | Evans | 361/393 |
|---|---|---|---|
| 3,573,373 | 4/1971 | Mullin | 174/72 A |
| 4,037,910 | 7/1977 | Paluch | 361/428 |
| 4,039,902 | 8/1977 | Lacan | 361/394 |

FOREIGN PATENT DOCUMENTS 2148399  4/1973  Fed. Rep. of Germany.

*Primary Examiner*—Gerald P. Tolin

*Attorney, Agent, or Firm*—Hill, Gross, Simpson, Van Santen, Steadman, Chiara & Simpson

[57] ABSTRACT

A receptacle fixture for equipment units each having a housing containing plug-in component assemblies characterized by the fixture comprising a pair of spaced, elongated spars forming a cable chute and having a contact strip with a first group of wrapping posts protruding from a surface thereof for forming connections with central office and ring wiring and having a bracket-like mounting assembly for each of the equipment units spaced along the spars. The mounting assemblies include guide rails for receiving the housing of the equipment unit and fastening means for attaching the housing on the fixture. Each housing has a printed circuit board provided with internal wiring for the equipment unit disposed on the side of the housing adjacent the contact strip with the printed circuit board having openings for receiving the wrapping posts of the contact strip so that they will protrude into the interior of the housing. In addition, each printed circuit board is provided on an inner surface with a group of contact blades which are in electrical communication to the printed conductors of the circuit board and each of the plug-in assemblies has an elongated spring contact strip for forming electrical contacts with the wrapping posts of the contact strip and the additional contact blades as the component is plugged into the housing of the equipment unit. Preferably, the contact strip is provided with longitudinally spaced, traversely extending slots to facilitate guiding wires for wrapping on the wrapping posts of the contact strip and the strip is provided with additionally spaced slots to enable tying cables containing the wires on a surface opposite the surface from which the wrapping posts extend.

4 Claims, 6 Drawing Figures

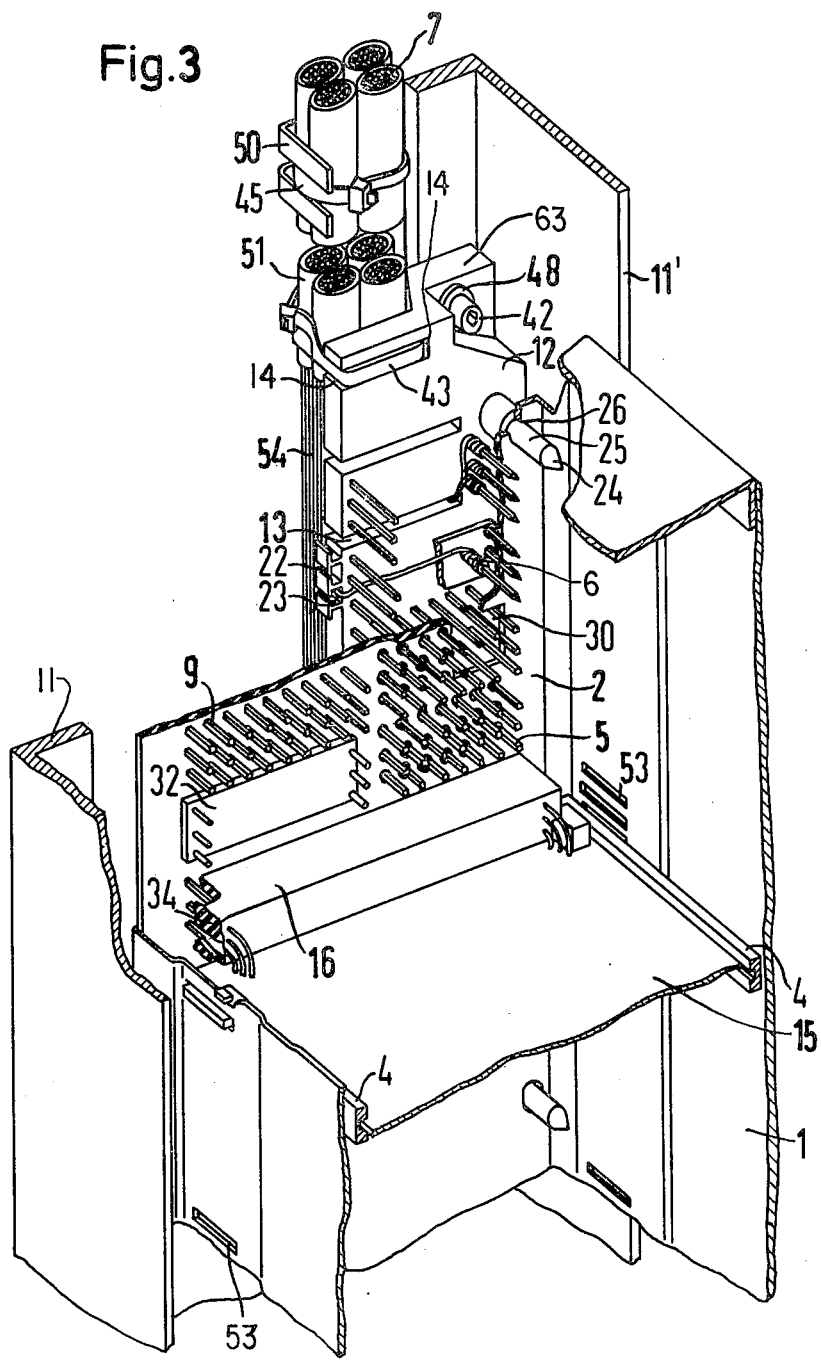

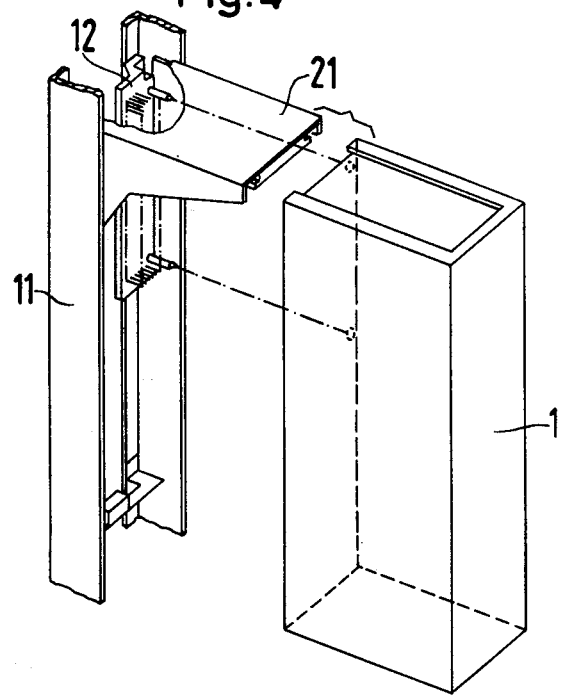
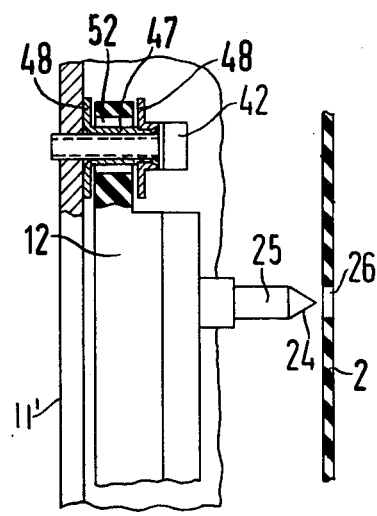
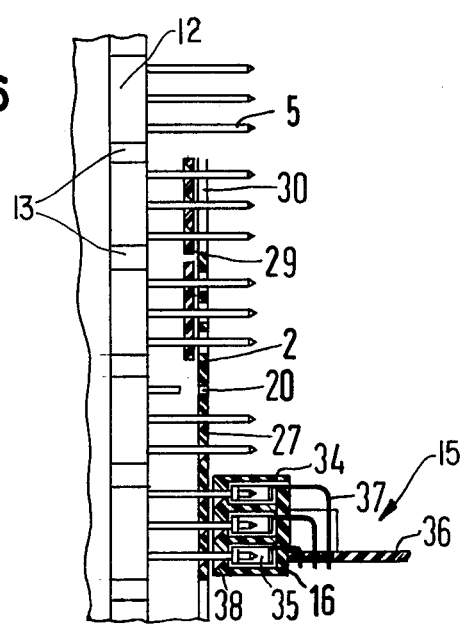

RECEPTACLE FIXTURE FOR EQUIPMENT UNITS IN ELECTRICAL COMMUNICATION TECHNOLOGY

BACKGROUND OF THE INVENTION

1. Field of the Invention

The present invention is directed to a receptacle fixture for equipment units which have a housing containing plug-in assemblies and are used in electrical communication technology. The fixture comprises two elongated, spaced spars forming a cable shaft or chute with the contact strips provided with wrapping posts for forming connections with a central office and ring wiring being disposed on one of the spars and the fixture includes bracket-like mounting assemblies attached to the spars in spaced relationship for mounting a housing of an equipment unit which has a back wall formed by a printed circuit board carrying internal wiring for the equipment unit.

2. Prior Art

Receptacle fixtures for equipment units in electrical communication technology with each of the equipment units having a housing containing plug-in component assemblies with a back wall of the housing being a printed circuit board provided with internal wiring for the equipment unit are known. These known fixtures have a pair of spaced, elongated spars, which form a cable chute or shaft, with a contact strip which has a group of wrapping posts protuding for forming connections with central office and ring wiring and the fixture has a bracket-like mounting assembly for each of the equipment units spaced along the spars which mounting units include guide rails for receiving the housing of the equipment unit and fastening means for attaching the housing unit on the fixture. An example of a known receptacle fixture is disclosed in German Auslegeschrift No. 2,148,399. Among other things, this known receptacle fixture has the advantage that a plurality of electrical connections can be formed in a small space.

SUMMARY OF THE INVENTION

The present invention is directed to an improvement in a receptacle fixture which improvements further simplify the structure of these fixtures.

To accomplish these tasks, a receptacle fixture for equipment units in electrical technology, each of said equipment units having a housing containing a plug-in component assembly, said fixture comprising a pair of spaced, elongated spars forming a cable chute and having the contact strip of the first group of wrapping posts protruding from a surface thereof for forming connections with central office and ring wiring, said fixture having a bracket-like mounting assembly for each of the equipment units spaced along said spars, said mounting assembly including guide rails for receiving the housing of an equipment unit and fastening means for attaching the housing on the fixture, each housing having a printed circuit board provided with internal wiring for the equipment unit disposed on the side of the housing adjacent to the contact strip with the improvements comprising the printed circuit boards of each housing being provided with openings for receiving the wrapping posts of the contact strip with the wrapping posts protruding through the openings and into the housing, additional contact posts being provided on an inner surface of the printed circuit board and extending therefrom into the interior of the housing, said additional contact posts being electrically connected to printed conductors on the circuit board and each of the plug-in component assemblies having elongated spring contact strips for forming electrical contact with the wrapping posts of the contact strip and additional contact posts as the plug-in component assembly is plugged into the housing of the equipment unit.

Due to these measures, there is a savings of one plug level vis-a-vis the previously known arrangements. The plug-in contact strips which are used have a simplified construction and as a result of this construction, need no separate mounting or housing of their own. In addition, for a given amount of space the design of the structure of the plug-in connection enables utilizing more connections than in the previously known structures.

In order to make possible a rapid arrangement and threading-in of the wires of the central office cables, the contact strips are provided with a plurality of spaced slots which extend transverse to the longitudinal axis thereof.

In further refinement of the invention, the contact strips have offset mounting portions which are provided with a bore hole. Each of the bore holes receives a bushing which has a smaller diameter than the bore hole and which bushing is provided with flanges at both ends to prevent removal of the bushings from the bore hole. The contact strip is thus attached to the receptacle fixture such as attachment to one of the spaced spars by a threaded fastener that secures the bushing to the spar and enables tilting and floating movement of the contact strip relative to the spar. In addition, each of the holes in the printed circuit board forming the rear wall of the housing is constructed so that the portion of the printed circuit board is an aperture plate acting as a gauge or template which corrects for bending or misalignment of the wrapping posts of the contact strips which may occur during the step of forming the connections by winding wire thereon. To facilitate the insertion of the wrapping posts of the contact strip through the holes in the printed circuit board, the contact strip and the printed circuit board are provided with coacting guide pins and apertures to obtain the desired alignment. Thus, these structural features produce an automatic alignment of the wrapping posts of the contact strip even though they may have been bent by the wrapping operation and enable a proper plugging-in of the plugging-in assembly without too great a demand on the spacing tolerances.

To facilitate the fastening of the central office cables, the contact strips can be provided at a top end with openings or apertures so that the central office cable and any internal cables of the fixture can be fastened directly behind the contact strips with tying bands. It is also possible to provide holders on the side spar to which the cables may attach by means of bands.

In addition, the receptacle fixture may be constructed in such a way that the contact strips are attached firmly to the frame spars and the equipment units are provided with suitable guide pins which are provided with conical ends and are engaged in holes in the contact strips. In addition, the pair of spars may be provided with brackets on which the equipment units are fastened preferably by means of a screw or bolt connection.

BRIEF DESCRIPTION OF THE DRAWINGS

FIG. 3 is an enlarged partial perspective view of the fixture device in accordance with the present invention;

FIG. 4 is a perspective view of a different embodiment of the receptacle fixture or device of the present invention;

FIG. 5 is a view with portions broken away illustrating a mounting of the contact strip in accordance with an embodiment of the present invention; and FIG. 6 is a view with portions in cross section illustrating the plug-in connection of the fixture in accordance with the present invention.

DESCRIPTION OF THE PREFERRED EMBODIMENTS

Figure 1:
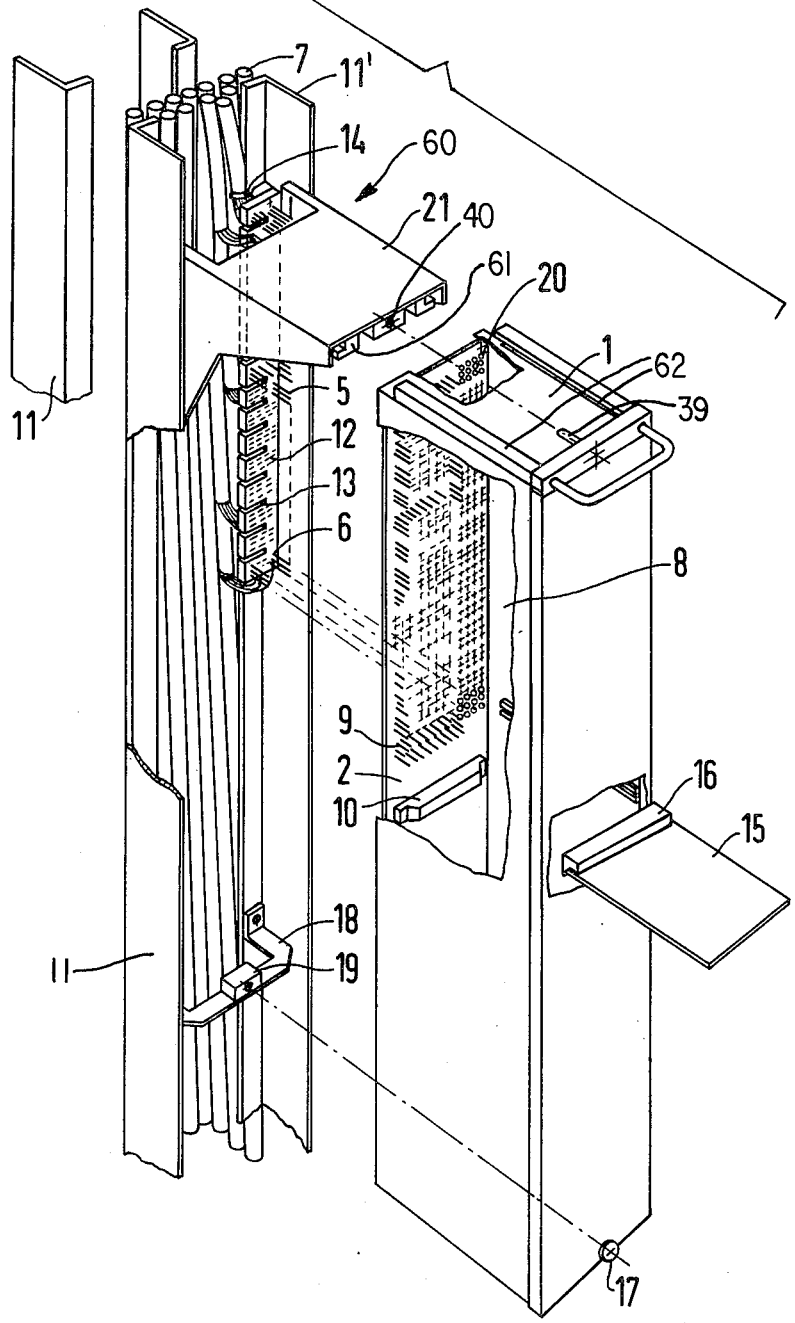
FIG. 1 is a perspective view of a partial disassembled receptacle fixture in accordance with the present invention.

The principles of the present invention are particularly useful in a receptacle fixture or device generally indicated at 60 in FIG. 1 for equipment units 1 which are used in electrical communication technology.

As illustrated, the device 60 includes two spars 11, 11', which are elongated and spaced apart by a bracket-like mounting assembly 21 and U-shaped bracket 18 to form a cable chute, run or shaft for cables 7 which may extend to a central office. In addition, the cable chute formed by the spars 11, 11' may include cables 51 (FIG.3) for internal frame wiring such as ring wiring which carries alarms, signals, current supply and carrier lines from one equipment unit 1 to another equipment unit 1 or various component assemblies within a single equipment unit 1.

In order to connect the various wires of the cable such as 7, a spar contact strip 12 is attached to either the right or left hand spar and as illustrated in FIG. 1 to the right hand spar 11'. The contact strip 12 is a synthetic material body having a plurality of wrapping posts or pins 5 embedded therein and extending from one surface of the strip 12 in a desired pattern or raster with rows of spaced posts. To connect the various wires in the cables such as 7 to the desired post 5, the individual wires are guided to a desired or designated wrapping post 5 and wound therearound with a winding 6 (best illustrated in FIG. 3). Due to the open nature of the fixture 60 and due to the fact that the cable chute formed by the spars 11 and 11' is readily excessible from the front, wrapping of the various wires on the respective wrapping posts 5 can be easily accomplished. To facilitate dividing up the various wires in a given cable 7, the contact strip 12 is provided with a plurality of spaced, horizontal slots 13, which extend transverse to the longitudinal axis of the strip 12 and provide the strip 12 with a comb-like appearance. The slots 13 as illustrated are arranged in accordance with the plug-in spacing provided for the wrapping post 5 which consists of a three row group which is separated from each other by a slot 13 (see FIG. 6). In addition to the slots 13, contact strip 12 is provided with at least one pair of spaced slots or apertures 14 (FIG. 3) adjacent an upper end to receive a band 43 to enable securing or tying off the cables on a rear surface of the strip 12.

Equipment unit 1 has a housing with an interior 8 (FIG. 1) with a rear wall or surface being formed by a printed circuit board 2. The printed circuit board 2 has a plurality of spaced openings or apertures 20, which are arranged in the same pattern as the wrapping posts 5 of the contact strip 12. In addition, the printed circuit board 2 has a plurality of additional contact posts or blades 9 which are embedded in the board 2 in a desired pattern and extend into the cavity or interior 8 of the housing of the unit 1. The posts 9 are arranged in rows that are aligned with the rows of posts 5 and each of the blades or posts 9 is connected to a desired conductive pattern (not illustrated) of the printed circuit board 2 such as by a wave soldering technique. In addition, a multiple pole spring contact strip 10, which extends across the width of the board 2 may be provided and is likewise connected to various conductive paths of the circuit board 2 by wave soldering. As illustrated, the openings 20 as well as the contact strip 12 of the fixture 60 only extend a part of the length of the housing for the unit 1 and, therefore, the multiple pole spring contact strip 10 is positioned on the board 2 in spaced relationship to the openings, 20. While the strip 10 is illustrated as being positioned below the plurality of spaced openings 20, it may also be positioned above these openings.

To mount and secure a unit 1 on the fixture 60, the bracket-like mounting assembly 21 is provided with a pair of guiding slides 61, which coact with slides 62 on the housing of the unit 1. Thus, the unit 1 can be inserted on the bracket-like mounting assembly 21 until the wrapping posts 5 are received in the respective openings 20 and extend therethrough into the interior or cavity 8 of the housing for the unit 1. To facilitate proper alignment of the openings 20 with the posts 5, guide or alignment means comprising guiding pin 39 disposed on the housing of the unit 1 coacts with an alignment or guiding bore or opening 40, which is provided on the mounting assembly 21. To secure the unit 1 on the fixture 60, the U-shaped bracket 18 is provided with a threaded block 19, which receives a threaded fastener 17 that extends through the housing and engages the block 19.

With the unit 1 assembled on the fixture or device 60, the contact blades or posts 9 of the printed circuit board 2 as well as the wrapping posts 5 are extending into the chamber 8 for connection to a plug-in component assembly 15 which is provided with a spring contact strip 16 along one end. The plug-in component assembly includes a printed circuit board 36 (FIG. 6) which has the desired circuitry for the assembly and the desired electrical components (not illustrated). The contact strip 16 includes an insulative body 34, which has three rows of contact springs 35 in a desired millimeter or inch raster pattern, for example a 5 millimeter raster. Each of the spring contacts 35 is connected to the desired portion of the circuit pattern on the board 36 by a lead 37 such as by a wave soldering process. The body 34 has a conical or converging lead-in opening 38 for each of the blade contacts 35 to facilitate plugging-in of the spring contact strip 16 on the blades or posts 9 as well as the wrapping posts 5. The conical openings 38, which have a funnel shape, compensate for variations in alignment tolerances of the free standing wrapping posts 5 and contact blades 9 and guarantee the formation of the desired circuit during plugging-in operations. As illustrated, the spring contact strip 16 is a three tiered strip with the lowest tier or row lying in the plane of the circuit board 36 and this construction, which can be achieved in a conventional way, for example by riveting, provides a space saving embodiment for the assembly 15. Thus, with insertion of the assembly 15 into the housing as illustrated in FIG. 2, wiring connections of the posts 9 and 5 provide electrical connections to various portions of the central office and frame wiring along with internal wiring of the assembly 15 which may contain various components which are not illustrated.

Figure 2:
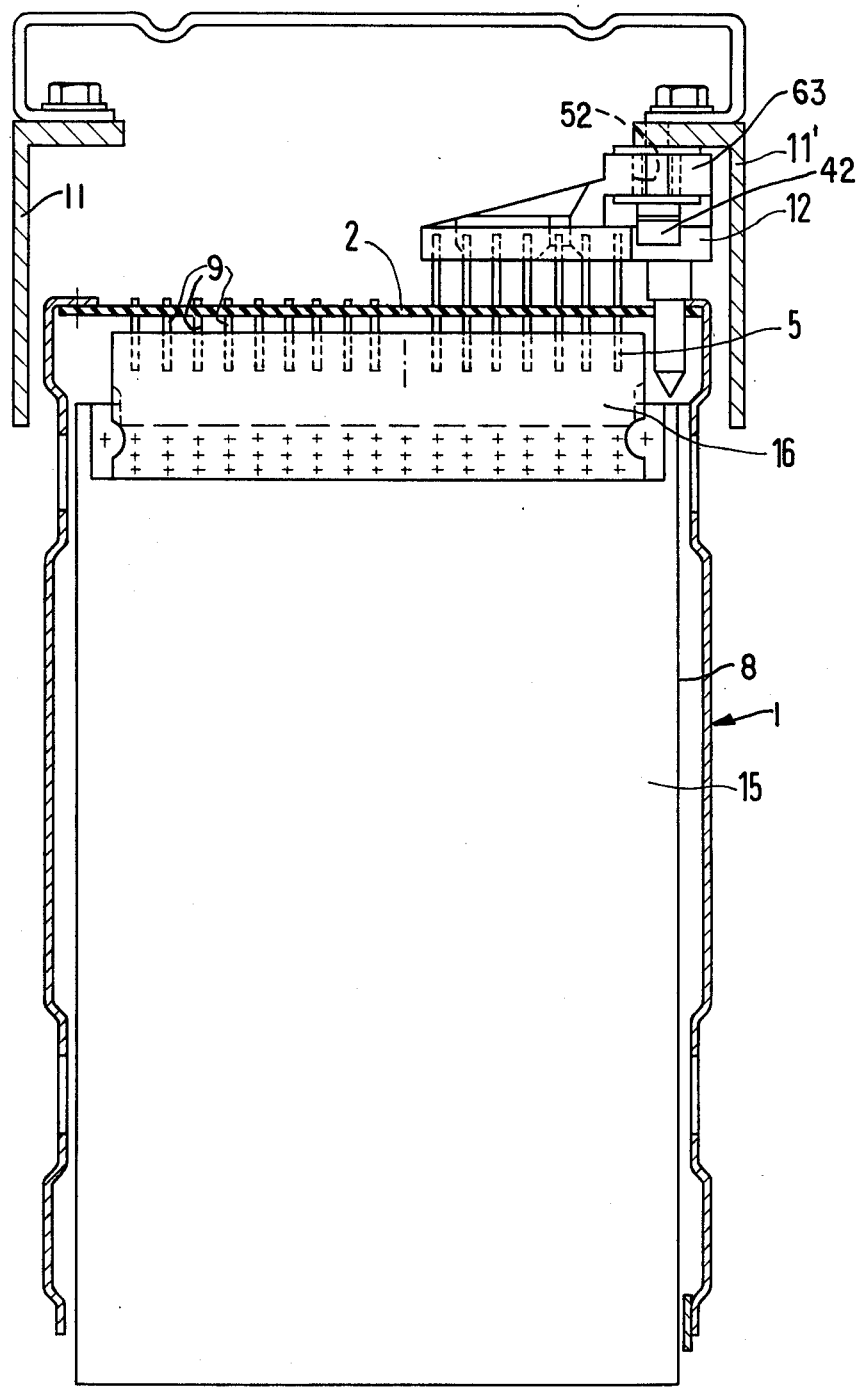
FIG. 2 is a horizontal cross-sectional view of a receptacle fixture in accordance with the present invention.

As best illustrated in FIG. 2, each of the plug-in assemblies 15 may be supported in the interior of the housing of the unit 1 strictly by the engagement of the spring contact strip 16 on the posts 5 and 9. However, if desired, the inside surfaces of the walls forming the housing for the unit 1 may be provided with guide rails 4 (FIG. 3) which have tabs received in slots such as 53. As mentioned hereinbefore, the cables 7 for the central office may be secured or tied to a back or reverse side of the strip 12 by a band 43 extending through slots or openings 14. In addition, a band 45 may be utilized along with brackets such as 50 which are attached to the spars such as 11'. As illustrated, cables 7 along with the internal cables 51 are stripped so that the individual leads or wires 54 may be guided through the selected horizontal slots 13 for wrapping on a post 5. In the embodiment illustrated in FIG. 3, the strip 12, which has a comb-like configuration, has a plurality of holes or openings 23, which are located along one edge and have entry slots 22 that extend to the edge. The openings 23 may be used for guiding a lead such as 34 to a desired post 5.

While the embodiment of FIG. 1 utilized guide means comprising a pin on the housing of the unit 1 coacting with a guiding bore in the mounting assembly 21, guide pins such as 25 may be mounted directly on the contact strip 12 and are provided with a tapered or conical point 24 to facilitate insertion into a guiding hole 26 formed in the circuit board 2. Thus, during insertion or assembly of the unit 1 on the mounting bracket 21, the guide pins 25 will be received in the holes 26 to ensure proper alignment between the openings 20 in the circuit board 2 and the posts 5. As best illustrated in FIG. 6, each of the holes 20 may be provided with a funnel-shaped or countersunk portion 27 facing the strip 12 to receive and align the individual posts 5 as the unit 1 is assembled on the fixture 60. This alignment will compensate for any bending of the posts 5 during the winding operation.

Instead of utilizing funnel-shaped portion 27 of the holes 20, an aperture plate 29 (FIG. 6) which acts as a gauge or template may be inserted on the wrapped posts 5 prior to insertion or assembly of the unit 1 onto the fixture 60. When using the aperture plates 29, the holes 20 in the circuit board 2 may be replaced by a larger opening 30, such as illustrated in both FIGS. 3 and 6. The contact blades or additional posts 9 which extend from the circuit board 2 may be embedded therein or in the case of a multi-layer contact board 2 held in their desired position by strip or batten bodies 32 (FIG. 3).

In the embodiment of the invention illustrated in FIG. 1, the guiding means utilized during the insertion of the unit 1 into the mounting assembly 21 acts between the unit 1 and the mounting assembly 21. When using the guiding means comprising the pin 25 mounted on the contact strip 12 and the guide hole 26 in the circuit board 2, as illustrated in FIGS. 4 and 5, the contact strip 12 may be floatingly attached to the side spars such as 11'. To accomplish this, the contact strip 12 is provided with a bore 52 preferably in an offset portion 63, and the bore 52 receives a bushing 47 that has a smaller diameter than the bore 52 and is provided with a pair of flanges 48, 48 to prevent removal of the bushing from the bore 52. The bushing is secured by a threaded fastener such as a machine screw 42 to the spar 11' and thus the contact strip 12 may be tilted or moved relative to the spar 11'. Thus, during insertion, the alignment means comprising the pin 25 and the hole 26 can move contact strip 12 relative to the spar 11' to align the posts 5 with the various apertures or openings 20 on the circuit board 2. While this feature has been described with the pin mounted directly on the strip 12, the pin and holes can be reversed with the pin being mounted on the circuit board 2 and received in a guide bore which is provided in the contact strip 12.

It should be noted that while the embodiments of the invention were described with the mounting member 21 engaging an upper end of the housing of the unit 1, it can be designed to engage or support a lower end with the mounting or securing bracket 18 disposed adjacent the upper end. Also, it should be noted that if more than one unit 1 is being attached to the fixture, there is a bracket-like mounting assembly 21 for each unit which mounting assemblies are spaced the necessary distance along the spars 11, 11' to allow insertion of each unit 1.

Due to the particular mounting of the posts 5 on each of the contact strips 12 and the mounting of the posts or blades 9 on the circuit board 2, their natural innate stability means that they do not require any additional housing or support. As pointed out hereinabove, any bending or slight misalignment of the posts 5 will be corrected by the template 29 or if the template is not utilized by the funnel-shaped openings 27 of the openings 20 during assembly of the unit 1. After the unit 1 is inserted, any remaining misalignment or slight bending of either the posts 5 or the contact blades or posts 9 will be automatically compensated for by the funnel-shaped openings 38 of the contact strip 16 during the plugging-in operation of the plug-in assemblies 15.

Although various minor modifications may be suggested by those versed in the art, it should be understood that we wish to embody within the scope of the patent warranted hereon, all such modifications as reasonably and properly come within the scope of our contribution to the art.

We claim:

1. In a receptable fixture including equipment units in electrical communication technology, each of said equipment units having a housing containing plug-in component assemblies, said fixture comprising a pair of spaced, elongated spars forming a cable chute and having a contact strip supported by at least one of said spars with a first group of wrapping posts protruding from a surface thereof for forming connections with a central office and ring wiring, said fixture having a bracket-like mounting assembly for each of the equipment units spaced and secured along said spars, said mounting assemblies including guiding slides which receive each equipment unit housing and fastening means for attaching the housing to the fixture, each housing having a printed circuit board provided with internal wiring for the equipment unit disposed on a side of the housing adjacent to the spar contact strip, the improvements comprising the printed circuit board of each housing being provided with openings receiving the wrapping posts of the spar contact strip with the wrapping posts protruding through the openings and into the housing, additional contact posts being provided on an inner surface of the printed circuit board and extending therefrom into the interior of the housing, said additional contact posts being electrically connected to printed conductors on each circuit board, and each plug-in component assembly having an elongated spring contact strip forming electrical contact with the wrapping posts of the spar contact strip and the additional contact posts as the plug-in component assembly is plugged into the housing of the equipment unit.

2. In a receptacle fixture according to claim 1, wherein said spar contact strip is provided with at least one pair of spaced slots to enable tying cables containing wiring to a back surface of the spar contact strip.

3. In a receptacle fixture according to claim 1, wherein the spar contact strip has a plurality of spaced slots extending transverse to a longitudinal axis thereof to facilitate guiding wires for wrapping on the wrapping posts of the spar contact strip.

4. In a receptacle fixture according to claim 3, wherein the spar contact strip includes at least a set of additional spaced slots to enable tying of cables containing wires on a surface opposite the surface from which the wrapping posts extend.

* * * * *